(12) United States Patent
Eshima

(10) Patent No.: US 8,607,730 B2
(45) Date of Patent: Dec. 17, 2013

(54) METHOD OF REPLACING LIQUID OF CIRCULATION LINE IN SUBSTRATE LIQUID PROCESSING APPARATUS OF SINGLE-WAFER TYPE

(75) Inventor: Kazuyoshi Eshima, Koshia (JP)

(73) Assignee: Tokyo Electron Limited, Minato-Ku (JP)

( * ) Notice: Subject to any disclaimer, the term of this patent is extended or adjusted under 35 U.S.C. 154(b) by 443 days.

(21) Appl. No.: 12/958,695

(22) Filed: Dec. 2, 2010

(65) Prior Publication Data

US 2011/0132465 A1   Jun. 9, 2011

(30) Foreign Application Priority Data

Dec. 7, 2009   (JP) ................................. 2009-277856

(51) Int. Cl.
*F16K 21/18* (2006.01)
*F16K 31/20* (2006.01)
*C23F 1/00* (2006.01)
*B05C 11/00* (2006.01)

(52) U.S. Cl.
USPC ......... 118/694; 156/345.18; 118/73; 137/389

(58) Field of Classification Search
USPC ............ 137/389, 396, 563; 118/73, 602, 694; 156/345.18
See application file for complete search history.

(56) References Cited

U.S. PATENT DOCUMENTS

| | | | |
|---|---|---|---|
| 5,887,602 A | 3/1999 | Iwama | |
| 6,780,277 B2* | 8/2004 | Yokomizo et al. | ........ 156/345.11 |
| 6,878,303 B2* | 4/2005 | Okamoto | ......................... 216/93 |
| 2007/0134822 A1* | 6/2007 | Yamamoto et al. | ............. 438/14 |
| 2008/0023049 A1 | 1/2008 | Matsumoto et al. | |

FOREIGN PATENT DOCUMENTS

| | | |
|---|---|---|
| JP | 08-102457 A1 | 4/1996 |
| JP | 2005-093769 A1 | 4/2005 |
| JP | 2008-034490 A1 | 2/2008 |

\* cited by examiner

*Primary Examiner* — Craig Schneider
*Assistant Examiner* — Michael R Reid
(74) *Attorney, Agent, or Firm* — Burr & Brown, PLLC

(57) ABSTRACT

An apparatus and method of replacing a liquid of a circulation line in a substrate liquid processing apparatus of a single-wafer type, which can replace the liquid more efficiently, by relating the replacing method with a process-liquid replenishing method. A substrate liquid processing apparatus of a single-wafer type includes: a circulation line through which a process liquid is circulated; a tank disposed in the circulation line; a liquid level sensor disposed in the tank; a liquid replenish part configured to replenish the tank with a new process liquid, based on an output of the liquid level sensor; and a liquid-replacement control part configured to stop the operation of the liquid replenish part based on a predetermined replenish stop condition that is set cooperatively with a predetermined liquid disposal condition, and to discard all the process liquid in the tank based on the predetermined liquid disposal condition.

6 Claims, 4 Drawing Sheets

Liquid replacement timing is set based on the number of wafers to be processed (for example, the liquid is replaced after one hundred wafers have been processed).

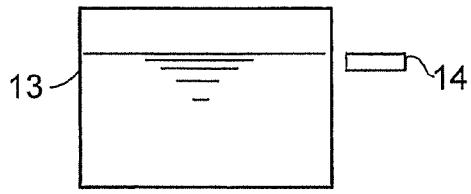

FIG. 3(a)

The liquid is replenished correspondingly to 100-X wafers. Thereafter, no liquid is replenished. The position at which the replenishment of liquid has been completed after (100-X) wafers have been processed.

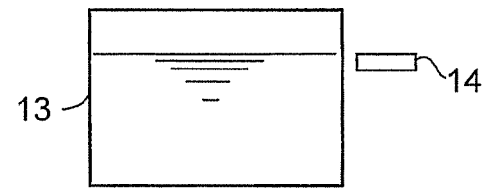

FIG. 3(b)

The liquid amount after (100-X+α) wafers have been processed: the liquid amount is decreased for each time when a wafer is processed.

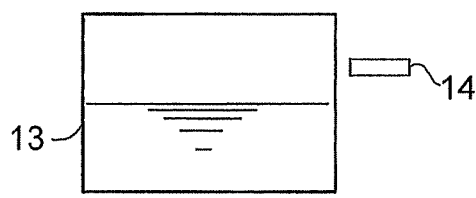

FIG. 3(c)

The liquid amount after 100 wafers have been processed: the liquid amount reaches the lower limit position.

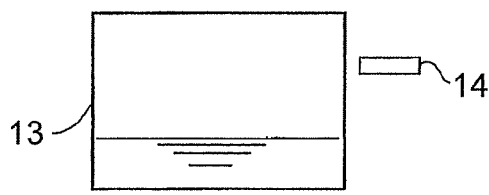

FIG. 3(d)

Liquid replacement: the amount of liquid to be drained can be reduced.

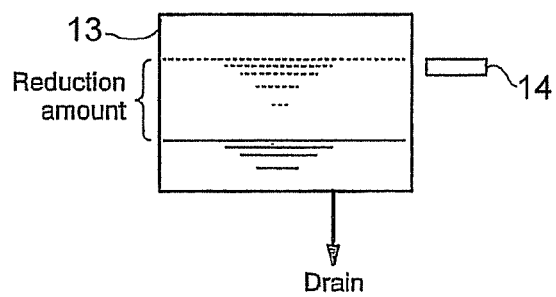

FIG. 3(e)

Liquid replacement timing is set based on a replacement time
(for example, the liquid is replaced for every 12 hours).

FIG. 4(a)

The liquid is replenished correspondingly to 12-Y hours. Thereafter, no liquid is replenished.
The position at which the replenishment of liquid has been completed after (12-Y) hours
have passed.

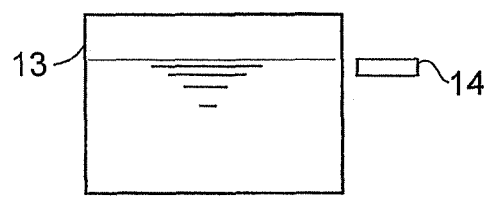

FIG. 4(b)

The liquid amount after (12-Y+α) hours have passed:
the liquid amount is decreased for each time when a wafer is processed.

FIG. 4(c)

The liquid amount after 12 hours have passed:
the liquid amount reaches the lower limit position.

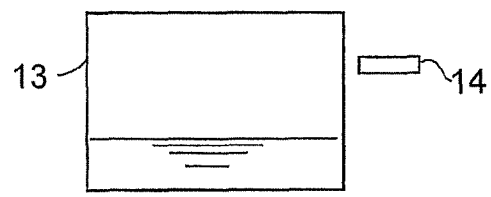

FIG. 4(d)

Liquid replacement: the amount of liquid to be drained can be reduced.

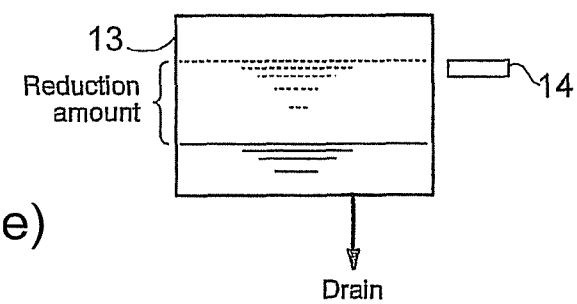

FIG. 4(e)

METHOD OF REPLACING LIQUID OF CIRCULATION LINE IN SUBSTRATE LIQUID PROCESSING APPARATUS OF SINGLE-WAFER TYPE

CROSS REFERENCE TO RELATED APPLICATIONS

This application is based upon and claims the benefit of priority from the prior Japanese Patent Application No. 2009-277856 filed on Dec. 7, 2009, the entire contents of which are incorporated herein by reference.

FIELD OF THE INVENTION

The present invention relates to a method of replacing a liquid of a circulation line in a substrate liquid processing apparatus of a single-wafer type which processes objects to be processed one by one with the use of a liquid. In addition, the present invention relates to a program for performing the method of replacing a liquid of a circulation line in a substrate liquid processing apparatus of a single-wafer type which processes objects to be processed one by one with the use of a liquid, and a storage medium storing the program.

BACKGROUND OF THE INVENTION

In the manufacture of semiconductor products and the manufacture of flat panel displays (FPDs), there is generally used a liquid, process in which a process liquid is supplied to semiconductor wafers or glass substrates as substrates to be processed. As such a process, there is a cleaning process for removing particles and contaminations adhering to substrates, for example.

As a liquid processing apparatus configured to perform such a liquid process, there is known an apparatus including a plurality of processing units of a single-wafer type, and a transfer apparatus that loads and unloads substrates to and from the processing units. Each of the processing units is configured to hold a substrate such as a semiconductor wafer on a spin chuck, and to supply a process liquid to a front surface of the substrate or a front surface and a rear surface of the substrate, while rotating the substrate so as to process the substrate. In addition, in order to achieve a higher throughput while restraining increase of a footprint of the apparatus, a layout in which these processing units are stacked at multiple levels is generally used (see, JP2005-93769A, for example).

In such a liquid processing apparatus, process-liquid supply units for supplying process liquids (chemical liquids) are disposed for respective process liquids. These process liquids are individually circulated and supplied.

JP2008-34490A describes a space-saving technique in a liquid processing apparatus including a plurality of processing units.

In addition, JP8-102457A describes a liquid replacing method in a liquid processing apparatus of a batch type which simultaneously processes a plurality of objects to be processed with the use of a liquid.

A circulation line of a process liquid (chemical liquid) has a tank for storing the process liquid. The circulation line is formed so as to extend from the tank and to return to the tank. As the liquid process progresses, not all the process liquid is returned to the tank, but a part of the process liquid is discarded. Thus, the amount of the process liquid in the tank gradually decreases. When the amount of the process liquid in the tank decreases to a certain degree, it is necessary to replenish the tank with a new process liquid.

As shown in FIG. 5, a conventional tank is provided with a liquid level sensor 101 for starting replenishment, and a liquid level sensor 102 for terminating replenishment. When the liquid level sensor for starting replenishment detects that the liquid level falls below a liquid level for starting replenishment, a replenishment of a process liquid is started. On the other hand, when the liquid level sensor for terminating replenishment detects that the liquid level exceeds a liquid level for terminating replenishment, the replenishment of the process liquid is terminated.

After the process liquid in the tank has been used for processing the predetermined number of substrates, the process liquid is replaced with a new process liquid. A conventional process-liquid replacing method is not particularly related with the aforementioned process-liquid replenishing method.

SUMMARY OF THE INVENTION

The inventors of the present invention have found the following problem in the above method of replenishing a process liquid, which uses a liquid level sensor for starting replenishment and a liquid level sensor for terminating replenishment. Namely, when there is a certain difference between a temperature of the process liquid remaining in the tank (which has been circulated hereto) and a temperature of a process liquid to be newly replenished, the temperature of the process liquid to be circulated may vary, which results in adverse effect on a process of substrates.

Further, the inventors of the present invention have found that the above method of replenishing a process liquid, which uses a liquid level sensor for starting replenishment and a liquid level sensor for terminating replenishment, is not suited for a liquid processing apparatus of a single-wafer type. Namely, in a liquid processing apparatus of a batch type, there is a sufficient time for replenishing a process liquid while substrates are replaced. However, in a liquid processing apparatus of a single-wafer type, since the time required for replacing substrates is short, the process of substrates and the replenishment of a process liquid temporally overlap each other. Thus, the substrate process is more vulnerable to an adverse effect caused by the temperature difference.

The present invention has been made in view of these circumstances. The object of the present invention is to provide a method of replenishing a process liquid of a circulation line in a substrate liquid processing apparatus of a single-wafer type, which will not affect a substrate process.

In addition, the object of the present invention to provide a method of replacing a process liquid of a circulation line in a substrate liquid processing apparatus of a single-wafer type, which can replace the process liquid more efficiently, by relating the replacing method with the process-liquid replenishing method.

The present invention is a substrate liquid processing apparatus of a single-wafer type, comprising: a circulation line through which a process liquid is circulated; a tank disposed in the circulation line; a liquid level sensor disposed in the tank; a liquid replenish part configured to replenish the tank with a new process liquid, based on an output of the liquid level sensor; and a liquid-replacement control part configured to stop an operation of the liquid replenish part based on a predetermined replenish stop condition that has been set cooperatively with a predetermined liquid disposal condition, and to discard all the process liquid in the tank based on the predetermined liquid disposal condition.

According to the present invention, the liquid-replacement control part is configured to stop the operation of the liquid replenish part, based on the predetermined replenish stop condition that has been set cooperatively with the predetermined liquid disposal condition. Thus, an amount of the liquid to be discarded can be minimized, i.e., the process liquid can be significantly efficiently replaced.

For example, it is preferable that the predetermined liquid disposal condition and the predetermined replenish stop condition are determined based on the number of substrates to be processed by the process liquid for each replacement. To be specific, when the process liquid is to be replaced for each time when one hundred substrates are processed, the situation in which one hundred substrates have been processed is set as the predetermined liquid disposal condition. In cooperation therewith, when a substantial capacity of the tank (a difference between a minimum amount and a maximum amount at which the circulation of the process liquid can be maintained) corresponds to an amount of the process liquid which is consumed (decreased) by the process of thirty substrates, for example, the situation in which seventy substrates (100−30=70) have been processed is set as the predetermined replenish stop condition. Namely, after seventy substrates have been processed, the operation of the liquid replenish part is stopped, so that no process liquid is replenished. Then, when the process of subsequent thirty substrates is finished (when the process of the hundredth substrate is finished), the contents of the tank become the minimum amount allowing the circulation of the process liquid. Thus, if the process liquid is discarded at this timing, only the minimum amount of the process liquid is discarded, whereby the significantly efficient replacement of the process liquid can be achieved.

Alternatively, for example, it is preferable that the predetermined liquid disposal condition and the predetermined replenish stop condition are determined based on a time of use of the process liquid for each replacement. To be specific, when the process liquid is to be replaced for each time when the process liquid is used for twelve hours, the situation in which the process liquid has been used for twelve hours is set as the predetermined liquid disposal condition. In cooperation therewith, when a substantial capacity of the tank (a difference between a minimum amount and a maximum amount at which the circulation of the process liquid can be maintained) corresponds to an amount of the process liquid which is consumed (decreased) by the process of substrates for three hours, the situation in which the process of substrates has lasted for nine hours (12−3=9) is set as the predetermined replenish stop condition. Namely, after the process of substrates has lasted for nine hours, the operation of the liquid replenish part is stopped, so that no process liquid is replenished. Thereafter, when the subsequent process of substrates for three hours is finished (when the process of substrates for twelve hours is finished), the contents of the tank become the minimum amount allowing the circulation of the process liquid. Thus, if the process liquid is discarded at this timing, only the minimum amount of the process liquid is discarded, whereby the significantly efficient replacement of the process liquid can be achieved.

The liquid replenish part is configured to constantly replenish the process liquid little by little, based on the output of the only one liquid level sensor (it is preferable that, when the liquid level falls below the detection level of the liquid level sensor, the liquid replenishment operation is immediately started, and that, when the liquid level exceeds the detection level of the liquid level sensor, the liquid replenishment operation is immediately terminated). Such a liquid replenishing method is preferred because a temperature of the process liquid to be circulated is resistant to variances. In addition, since each liquid replenishing step is performed in a significantly short period of time, even in a liquid processing apparatus of a single-wafer type, an adverse effect by the liquid replenishing step on the process of substrates can be remarkably restrained.

In addition, the present invention is a method for replacing a liquid in a substrate liquid processing apparatus of a single-wafer type, including: a circulation line through which a process liquid is circulated; a tank disposed in the circulation line; a liquid level sensor disposed in the tank; a liquid replenish part configured to replenish the tank with a new process liquid, based on an output of the liquid level sensor; and a liquid-replacement control part configured to stop an operation of the liquid replenish part based on a predetermined replenish stop condition that has been set cooperatively with a predetermined liquid disposal condition, and to discard all the process liquid in the tank based on the predetermined liquid disposal condition, the method comprising: setting a predetermined liquid disposal condition and a predetermined replenish stop condition; stopping an operation of the liquid replenish part, based on the set predetermined replenish stop condition; and discarding all the process liquid in the tank, based on the set predetermined liquid disposal condition.

According to the present invention, the operation of the liquid replenishing part is stopped based on the predetermined replenish stop condition that has been set cooperatively with the predetermined liquid disposal condition. Thus, an amount of the liquid to be discarded can be minimized, i.e., the process liquid can be significantly efficiently replaced.

A program in one embodiment according to the present invention is a program executable by a control device for controlling a liquid processing apparatus, the program being configured to cause a liquid processing apparatus to perform the method in the above embodiment of the present invention upon execution of the program by the control device.

A storage medium in one embodiment according to the present invention is a storage medium storing a program executable by a control device for controlling a liquid processing apparatus, the program being configured to cause a liquid processing apparatus to perform the method in the above embodiment of the present invention upon the execution of the program by the control device.

BRIEF DESCRIPTION OF THE DRAWINGS

FIGS. 3(a)-3(e) schematically show the liquid replacing method in the liquid processing apparatus shown in FIG. 1.

FIGS. 4(a)-4(e) schematically show another liquid replacing method in the liquid processing apparatus shown in FIG. 1.

DETAILED DESCRIPTION OF THE INVENTION

Embodiments of the present invention will be described herebelow with reference to the drawings. The present invention can be typically applied to a process for cleaning a semiconductor wafer (an example of an object to be processed), in particular, a process using a chemical liquid (chemical liquid process). (However, the present invention is not limited to this application.)

Figure 1:
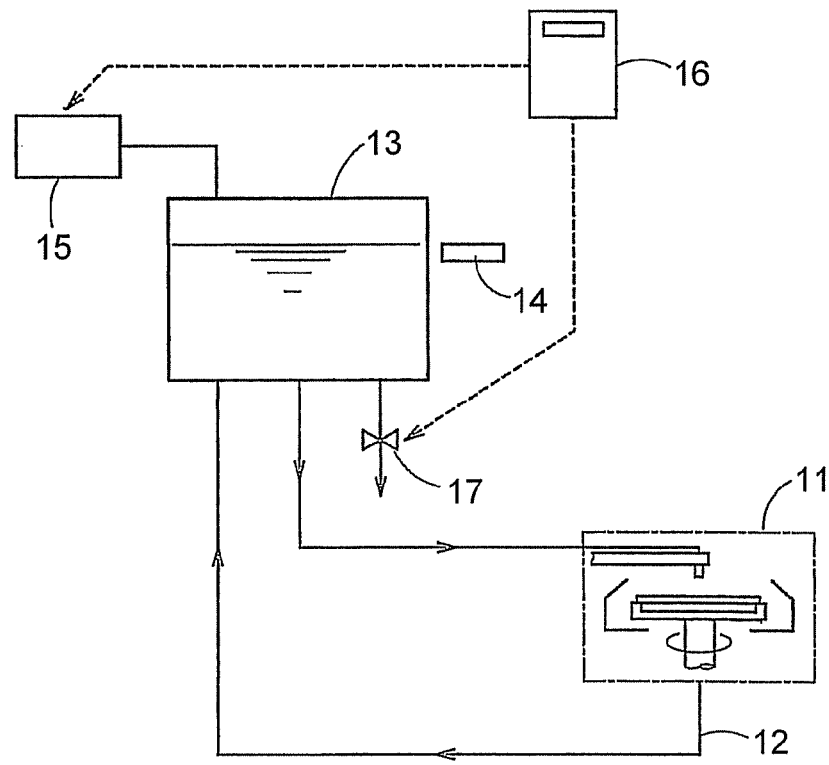
FIG. 1 is a view schematically showing a liquid processing apparatus according to one embodiment according to the present invention.
Figure 2:
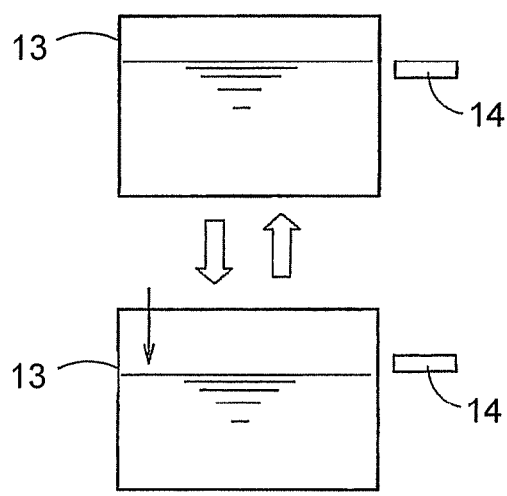
FIG. 2 is a view schematically showing the liquid replenishing method in the liquid processing apparatus shown in FIG. 1.

As shown in FIG. 1, a liquid processing apparatus 10 is a substrate liquid processing apparatus of a single-wafer type, and includes a substrate processing chamber 11 in which substrates are processed. Substrates are loaded and unloaded into and from the substrate processing chamber 11 one by one. Connected to the substrate processing chamber 11 is a circulation line 12 through which a process liquid is circulated. The circulation line 12 has a tank 13 for storing a process liquid. The tank 13 is provided with a liquid level sensor 14. In this embodiment, only one liquid level sensor 14 is disposed. As shown in FIG. 2, when a liquid level of the process liquid falls below a detection level of the liquid level sensor 14, a liquid replenish part 15 is configured to immediately start a liquid replenishment operation. The process liquid is constantly replenished little by little after the liquid level sensor has been turned off, so that it is possible to restrain an affect on the circulation system by a temperature difference of the liquid to be replenished. When the liquid level of the process liquid exceeds a detection level of the liquid level sensor 14, the liquid replenish part 15 is configured to immediately terminate the liquid replenishment operation. The liquid replenish part 15 is composed of, for example, a liquid supply part and a supply control valve.

On the other hand, the operation (the liquid replenishment operation) of the liquid replenish part 15 is configured to be stopped by a liquid-replacement control part 16, based on a predetermined replenish stop condition that has been set cooperatively with a predetermined liquid disposal condition. Further, the liquid-replacement control part 16 is configured to fully open a drain valve 17, for example, so as to discard all the process liquid in the tank 13, based on the predetermined liquid disposal condition.

A concrete example of the liquid replacing method is described with reference to FIG. 3. In the example shown in FIG. 3, a predetermined liquid disposal condition and a predetermined replenishment stop condition are determined based on the number of substrates to be processed by a process liquid for each replacement (FIG. 3(a)). More specifically, it is determined beforehand that the process liquid is to be replaced for each time when one hundred substrates are processed. In this case, the situation in which one hundred substrates have been processed is set as the predetermined liquid disposal condition in the liquid-replacement control part 16. In cooperation therewith, when a substantial capacity of the tank 13 (a difference between a minimum amount and a maximum amount at which the circulation of the process liquid can be maintained) corresponds to an amount of the process liquid which is consumed (decreased) by the process of thirty substrates, the situation in which seventy (100−30=70) substrates have been processed is set as the predetermined replenish stop condition in the liquid-replacement control part 16. That is, the number of wafers (X) can be processed without replenishment of the liquid is represented as X+A/B (ex.) X=30), in which a liquid amount that can be used (substantially equals to a liquid amount in a tank) is A(L), and a liquid amount that is used (consumed) for processing one wafer is B(L).

Under these conditions, after seventy substrates have been processed, the operation of the liquid replenish part 15 is stopped by the liquid-replacement control part 16 (FIG. 3(b)). That is to say, no liquid is replenished to the tank 13, until the subsequent liquid replacement is performed. Thereafter, substrates are continuously processed one by one, and the process liquid in the tank 13 is decreased for each time when a substrate is processed (FIG. 3(c)). Then, when the process of the hundredth substrate is finished, the contents of the tank become the minimum amount allowing the circulation of the process liquid (FIG. 3(d)). At this time, the predetermined liquid disposal condition is satisfied, so that the process liquid is discarded by the liquid-replacement control part 16 (FIG. 3(e)).

According to the above embodiment, only the minimum amount of the process liquid is discarded, whereby the significantly efficient replacement of the process liquid can be achieved.

Another concrete example of the liquid replacing method is described with reference to FIG. 4. In the example shown in FIG. 4, a predetermined liquid disposal condition and a predetermined replenishment stop condition are determined based on a time of use of a process liquid for each replacement (FIG. 4(a)). More specifically, it is determined beforehand that the process liquid is to be replaced for each time when the process of substrates lasts for twelve hours. In this case, the situation in which the process of substrates has lasted for twelve hours is set as the predetermined liquid disposal condition in the liquid-replacement control part 16. In cooperation therewith, when a substantial capacity of the tank 13 (a difference between a minimum amount and a maximum amount at which the circulation of the process liquid can be maintained) corresponds to an amount of the process liquid which is consumed (decreased) by the process of substrates for three hours, the situation in which the process of substrates has lasted for nine (12−3=9) hours is set as the predetermined replenish stop condition in the liquid-replacement control part 16. That is, the number of wafers (X) that can be processed without replenishment of the liquid is represented as X=A/B, and the time (Y (hour)) required for processing the X wafers is represented as Y=X*C=A/B*C, in which a liquid amount that can be used (substantially equals to a liquid amount in a tank) is A(L), a liquid amount that is used (consumed) for processing one wafer is B(L), and C (hour) is a time for processing one wafer (SPIN occupation time).

Under these conditions, after the process of substrates has lasted for nine hours, the operation of the liquid replenishment part is stopped by the liquid-replacement control part 16 (FIG. 4(b)). That is to say, no liquid is replenished to the tank 13, until the subsequent liquid replacement is performed. Thereafter, substrates are continuously processed one by one, and the process liquid in the tank 13 is decreased for each time when a substrate is processed (FIG. 4(c)). Then, when the process of substrates for twelve hours is finished, the contents of the tank become the minimum amount allowing the circulation of the process liquid (FIG. 4(d)). At this time, the predetermined liquid disposal condition is satisfied, so that the process liquid is discarded by the liquid-replacement control part 16 (FIG. 4(e)).

According to the above embodiment, only the minimum amount of the process liquid is discarded, whereby the significantly efficient replacement of the process liquid can be achieved.

Figure 5:
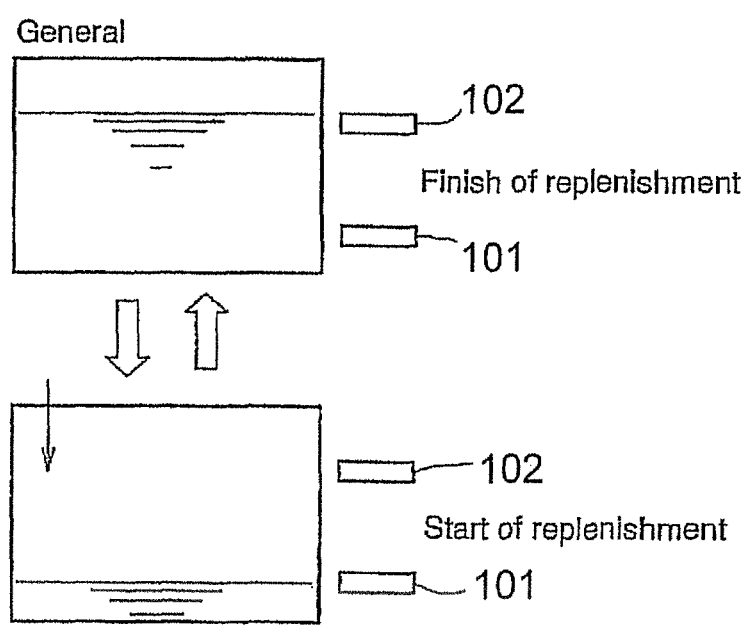
FIG. 5 is a view schematically showing a method of replenishing a process liquid in a conventional tank.

In the above respective embodiments, the only one liquid level sensor 14 is disposed. However, the liquid replacing method according to the present invention can be also applied to a conventional apparatus including two liquid level sensors (see, FIG. 5). In a single-wafer chemical-liquid circulation line, a tank sensor is disposed for liquid replenishment. When a liquid amount is decreased to reach a determined amount, the replenishment of liquid is started. When there is a difference between a temperature of a circulation liquid and a temperature of a liquid to be replenished, a temperature of the chemical liquid varies. In this case, by performing the last liquid replenishment operation at a time when the predetermined replenishment stop condition is satisfied, the liquid can be efficiently replaced similarly to the aforementioned embodiments.

Connected to the liquid-replacement control part 16 may be a keyboard by which a command can be inputted by a manager for managing the liquid processing apparatus 10, and an input/output device formed of a display or the like that visualizes an operational state of the liquid processing apparatus 10. In addition, the liquid-replacement control part 16 is accessible to a storage medium storing a program for realizing a process to be performed by the liquid processing apparatus 10. The storage medium may be formed of a known program storage medium, e.g., a memory such as a ROM or a RAM, a hard disc, and a disc-shaped storage medium such as a CD-ROM, a DVD-ROM, or a flexible disc.

The operations of the respective constituent elements for performing the aforementioned liquid replacing method may be controlled based on control signals from the liquid-replacement control part 16 based on a program previously stored in the program storage medium.

The invention claimed is:

1. A substrate liquid processing apparatus comprising:
   a substrate processing chamber in which substrates are processed one by one with use of a process liquid;
   a tank disposed in a line for the process liquid connected to the substrate processing chamber and configured to store the process liquid;
   a liquid level sensor disposed in the tank;
   a liquid discard part configured to discard the process liquid in the tank;
   a liquid replenish part configured to replenish the tank with a new process liquid; and
   a liquid-replacement control part configured to control the liquid discard part based on a liquid disposal condition that has been determined based on one of a number of substrates to be processed in the substrate processing chamber for each replacement and on a time of use of the processing liquid for each replacement, and to control the liquid replenish part based on an output of the liquid level sensor, wherein
   the liquid-replacement control part is configured to control the liquid replenish part to start a liquid replenish operation when a liquid level of the process liquid in the tank falls below a detection level of the liquid level sensor, and to control the liquid replenish part to terminate the liquid replenish operation when the liquid level of the process liquid in the tank exceeds a detection level of the liquid level sensor,
   the liquid-replacement control part is configured to control the liquid replenish part to stop the liquid replenish operation until the subsequent liquid replacement is performed while continuously processing the substrates in the substrate processing chamber when a replenish stop condition that has been set based on a difference between the liquid disposal condition and one of the number of substrates and the time of use of the process liquid corresponding to the substantial capacity of the tank is satisfied, and
   the liquid-replacement part is configured to control the liquid discard part to discard the process liquid in the tank when the liquid disposal condition is satisfied.

2. The substrate liquid processing apparatus according to claim 1, wherein
   the liquid replenish part is configured to constantly replenish the process liquid based on the output of the only one liquid level sensor.

3. A method for replacing a liquid in a substrate liquid processing apparatus, including: a substrate processing chamber in which substrates are processed one by one with use of a process liquid; a tank disposed in a line for the process liquid connected to the processing chamber and configured to store the process liquid; a liquid level sensor disposed in the tank; a liquid discard part configured to discard the process liquid in the tank; a liquid replenish part configured to replenish the tank with a new process liquid; and a liquid-replacement control part configured to control the liquid discard part based on a liquid disposal condition that has been determined based on one of a number of substrates to be processed in the substrate processing chamber and on a time of use of the process liquid for each replacement, and to stop an operation of the liquid replenish part based on an output of the liquid level sensor,
   the method comprising:
   controlling the liquid replenish part to start a liquid replenish operation when a liquid level of the process liquid in the tank falls below a detection level of the liquid level sensor, while controlling the liquid replenish part to terminate the liquid replenish operation when the liquid level of the process liquid in the tank exceeds a detection level of the liquid level sensor,
   controlling the liquid replenish part to stop the liquid replenish operation until the subsequent liquid replacement is performed while continuously processing the substrates in the substrate processing chamber when a replenish stop condition that has been set based on a difference between the liquid disposal condition and one of the number of substrates and the time of use of the process liquid corresponding to the substantial capacity of the tank is satisfied, and
   controlling the liquid discard part to discard the process liquid in the tank when the liquid disposal condition is satisfied.

4. The method according to claim 3, wherein
   the liquid replenish part is configured to constantly replenish the process liquid based on the output of the only one liquid level sensor, until the set predetermined replenish stop condition is satisfied.

5. A non-transitory storage medium for storing a program executable by a control device for controlling a liquid processing apparatus, the program being configured to cause a liquid processing apparatus to perform the method according to claim 4 upon execution of the program by the control device.

6. A non-transitory storage medium for storing a program executable by a control device for controlling a liquid processing apparatus, the program being configured to cause a liquid processing apparatus to perform the method according to claim 3 upon the execution of the program by the control device.

* * * * *